US007382079B2

(12) United States Patent
Kawase et al.

(10) Patent No.: US 7,382,079 B2
(45) Date of Patent: Jun. 3, 2008

(54) PIEZOELECTRIC DEVICE FOR GENERATING ACOUSTIC SIGNAL

(75) Inventors: Hideyuki Kawase, Sendai (JP); Yuji Nitobe, Sendai (JP)

(73) Assignee: NEC Tokin Corporation, Sëndai-shi (JP)

( * ) Notice: Subject to any disclaimer, the term of this patent is extended or adjusted under 35 U.S.C. 154(b) by 168 days.

(21) Appl. No.: 11/496,427

(22) Filed: Aug. 1, 2006

(65) Prior Publication Data

US 2007/0057601 A1 Mar. 15, 2007

(30) Foreign Application Priority Data

Sep. 9, 2005 (JP) ............................ 2005-262400

(51) Int. Cl.
*H01L 41/08* (2006.01)

(52) U.S. Cl. ...................... 310/322; 310/328; 310/334

(58) Field of Classification Search ................ 310/321, 310/322, 324, 328, 334
See application file for complete search history.

(56) References Cited

U.S. PATENT DOCUMENTS 4,644,213 A * 2/1987 Shibuya ...................... 310/328
4,706,230 A * 11/1987 Inoue et al. ................ 367/174
4,714,855 A * 12/1987 Fujimoto .................... 310/328
4,976,553 A * 12/1990 Yamaguchi et al. ... 400/124.16
RE34,823 E * 1/1995 Sakaida et al. ............. 310/328
5,406,531 A * 4/1995 Henriquez et al. .......... 367/157

FOREIGN PATENT DOCUMENTS

JP A 2000-201398 7/2000
JP A 2000-209697 7/2000

* cited by examiner

*Primary Examiner*—Mark Budd
(74) *Attorney, Agent, or Firm*—Oliff & Berridge, PLC

(57) ABSTRACT

There is provided a piezoelectric device for generating an acoustic signal in which an expansion mechanism expands a disposition of a laminated piezoelectric actuator by the principle of leverage. The mass of a base member placed in the expansion mechanism is larger than the mass of a vibration output member. An overall device size is small. The piezoelectric device has a pressurization structure for reducing a tractive force acting on the laminated piezoelectric actuator which is generated by the amplification. This enables provision of a piezoelectric device for generating an acoustic signal that is a small size, highly resistant to dropping impact, and has god acoustic performance with less sound leakage.

7 Claims, 14 Drawing Sheets

*RELATED ART*

*RELATED ART*

*RELATED ART*

PIEZOELECTRIC DEVICE FOR GENERATING ACOUSTIC SIGNAL

BACKGROUND OF THE INVENTION

1. Field of the Invention

The present invention generally relates to a device for generating an acoustic signal which is applicable to a loudspeaker that generates acoustic vibration in air, a headphone that is directly held against the ear for listening, a bone conduction speaker that transfers acoustic vibration through a cranial bone to be listened by auditory nerve, and so on. Particularly, the present invention relates to a piezoelectric device for generating an acoustic signal which uses a piezoelectric element.

2. Description of Related Art

A piezoelectric device for generating an acoustic signal using a piezoelectric element typically employs a piezoelectric unimorph element or a piezoelectric bimorph element. FIGS. 1A and 1B are a perspective view and a side view, respectively, of a piezoelectric unimorph element. The piezoelectric unimorph element has a structure that a thin circular piezoelectric ceramic plate 21 having a diameter of about 20 mm and a thickness of about 0.1 to 0.3 mm is adhered to one surface of a thin circular metal plate 22 having a diameter of about 30 mm and a thickness of about 0.1 mm. FIGS. 2A and 2B are a perspective view and a side view, respectively, of a piezoelectric bimorph element. The piezoelectric bimorph element has a structure that the piezoelectric ceramic plate 21 is adhered to both surfaces of the metal plate 22.

The frequency characteristics of an acoustic pressure as an acoustic performance of the piezoelectric unimorph element and the piezoelectric bimorph element are such that a large acoustic pressure is generated within a resonant frequency of several kHz of the piezoelectric unimorph element or the piezoelectric bimorph element while the acoustic pressure decreases significantly once the frequency falls outside the resonant frequency. Therefore, those elements are mainly used in the field of a piezoelectric sounder that generates an acoustic signal with a specific frequency. Further, if the thickness of a piezoelectric ceramic plate is reduced to under 0.1 mm, for example, and the outer shape of a diaphragm is 50 mmϕ, it can be used as a tweeter which is a speaker that is designed to deal with a high frequency of 1 kHz or higher.

There are various proposals to improve an acoustic pressure or frequency characteristics. FIG. 3 is a side view of a piezoelectric device for generating an acoustic signal according to a related art. The piezoelectric device for generating an acoustic signal has a structure that the center part of a piezoelectric bimorph element 23 is held by a support 25 and one end is fixed to a base 24. In this structure, a reaction force to the vibration generated at the center of the piezoelectric bimorph element 23 is transferred to the base 24 through the support 25 to thereby allow the base 24 to serve as a vibration plane. Accordingly, the area of the vibration plane is enlarged, thus enabling an increase in acoustic pressure. Further, this piezoelectric device combines the vibration mode of the piezoelectric bimorph element 23 and the vibration mode of the base 24, and has acoustic characteristics based on the combined vibration mode, thus capable of serving as a practical loudspeaker having a wide audio frequency range. Such a piezoelectric device for generating an acoustic signal is disclosed in Japanese Unexamined Patent Application Publications Nos. 2000-209697 and 2000-201398, for example.

In the use of the piezoelectric device for generating an acoustic signal for a cell phone, a portable terminal or the like, maximum miniaturization and high output are required. If a piezoelectric bimorph element is circular, its diameter is related to a resonant frequency in such a way that a smaller diameter leads to a higher resonant frequency to reduce a low frequency acoustic output. If a piezoelectric bimorph element is rectangular, its length is related to a resonant frequency in such a way that a shorter length leads to a higher resonant frequency to reduce a low frequency acoustic output. Further, its width is related to an amount of acoustic output in such a way that a narrower width leads to a smaller output. Accordingly, in order to produce a necessary acoustic frequency, it needs the displacement of mechanical vibration that is generated by a piezoelectric element in accordance therewith. Because the displacement of mechanical vibration is determined by the shape of a piezoelectric element, there is a limit to miniaturization while maintaining a desired acoustic output.

Further, a portable device such as a cell phone and a portable terminal should be resistant to dropping impact. However, in order to set the resonant frequency to a low frequency band by way of a small bend elastic coefficient, the piezoelectric unimorph element and piezoelectric bimorph element need to employ a very thin piezoelectric ceramic plate and metal plate. The mechanical strength of these elements is low and thus vulnerable to dropping impact.

Furthermore, in the use of the piezoelectric device for generating an acoustic signal using the piezoelectric unimorph element and piezoelectric bimorph element for a cell phone, a portable terminal or the like, it is typically incorporated into a case or housing. This causes vibration of a case or housing where an acoustic vibration should not be output, which leads to sound leakage to have people around a user hear the sound. It is thus unsuitable for application to the piezoelectric device for generating an acoustic signal that requires privacy feature. When the device is applied to a bone conduction speaker, the vibration occurring in a portion that is different from the portion though which vibration is transferred to a cranial bone and the airway sound are unwanted. Particularly, when a microphone is placed in the same housing, the microphone detects the leak sound to undesirably produce echo by acoustic coupling.

In order to overcome the above drawback, there has been a need for a piezoelectric device for generating an acoustic signal that is a small size, highly resistant to dropping impact, and has good acoustic performance with less sound leakage.

The present invention provides a means for generating an acoustic signal which is different from the piezoelectric unimorph element or piezoelectric bimorph element to thereby achieve size reduction, increase resistance to dropping impact, and improve acoustic performance by reducing sound leakage.

SUMMARY OF THE INVENTION

According to an aspect of the present invention, there is provided a piezoelectric device for generating an acoustic signal, including a piezoelectric element for converting an electrical signal into mechanical vibration, an expansion mechanism for expanding a displacement of the mechanical vibration generated by the piezoelectric element, and an acoustic vibration portion for transferring the displacement of the mechanical vibration expanded by the expansion mechanism as acoustic vibration. The expansion mechanism includes an elastic member, a vibration output member having a plate shape being more rigid than the elastic member, and a base member having a plate shape being more rigid than the elastic member and more massive than the vibration output member. The base member and the vibration output member face each other with the piezoelectric element interposed therebetween. One end portions of the base member and the vibration output member facing each other are connected by the elastic member, and the piezoelectric element is placed between one end of the vibration output member connected to the base member by the elastic member and a center of the vibration output member.

The present invention enables the use of a small-size and high-power piezoelectric element such as a laminated piezoelectric actuator as a drive source of vibration to thereby achieve miniaturization. This has been not attained in a conventional piezoelectric device for generating an acoustic signal that directly transfers the displacement of mechanical vibration generated by a piezoelectric unimorph element or piezoelectric bimorph element and enlarge the area of vibration to obtain desired acoustic vibration. Specifically, the displacement by expansion and contraction in longitudinal direction in an acoustic frequency range generated by a piezoelectric element such as a laminated piezoelectric actuator is expanded by the expansion mechanism, thereby obtaining a large amplitude. Because the weight of the unit of the base member is set greater than the weight of the unit of the vibration output member, when the displacement of the vibration of the piezoelectric element is expanded, the vibration is not transferred to the base member but concentrated on the vibration output member, thereby expanding the disposition efficiently. Further, sound leakage that is caused by the vibration of the base member is significantly reduced.

Furthermore, because the present invention does not use flexible transformation such as a piezoelectric unimorph element or a piezoelectric bimorph element, the piezoelectric element such as a laminated piezoelectric actuator can be very small-sized and strong without depending on the shape of the piezoelectric element in use. The use of resonant frequency by design of a vibration system including an expansion mechanism enables obtainment of a larger acoustic output.

For example, the expansion mechanism can have a beam structure.

In this invention, the expansion mechanism, which expands the displacement in an acoustic frequency range that the laminated piezoelectric actuator generates, is suitable for the beam structure such as a cantilever structure and a bridge structure or the like. All of the beam structure is formed of a metal, thus enabling the structure to increase the resistance to dropping impact. Furthermore, the most suitable design enables the resonance frequency to set in a low frequency range while the expansion mechanism is small. In general, the more displacement is expanded by the expansion mechanism, the more compressive force decreases. However, the compressive force generated by the laminated piezoelectric actuator acts with the high level, thus the generated force higher than the one generated by piezoelectric element can be introduced, enabling the larger acoustic output to be introduced. Therefore, the vibration output member in the vibration system including the laminated piezoelectric actuator is joined with a panel such as a vibration receiver, a housing, and a part of the human head or so like, enabling the larger acoustic output to be introduced.

Furthermore, at least a part of the expansion mechanism is formed by pressing a metal plate, thereby enabling the reduction of the manufacturing cost of the expansion mechanism.

The piezoelectric element is a columnar, and the expansion mechanism includes a pressurization portion for applying a compressive force to the piezoelectric element in a longitudinal direction.

In general, it is known that the columnar piezoelectric element such as a laminated piezoelectric actuator is not resistant to the tractive force in the longitudinal direction. The structure to apply a pressure as if the compressive force acts during non-operation can reduce the tractive force that resists the piezoelectric element highly inputting with high frequency.

The piezoelectric element is a columnar, and the expansion mechanism includes a thread for applying a compressive force that is adjustable by a fastening force of the thread to the piezoelectric element in a longitudinal direction. Thereby, the application of the compressive force and the generation of it can be easy, easily assembling the structure.

Furthermore, the piezoelectric element is surrounded by a viscous member or an elastic member in all directions different from a direction of an end of the piezoelectric element. Thereby, especially in the case of the columnar piezoelectric element, the vibration except in the longitudinal direction can be reduced, sound leakage reducing.

According to another aspect of the present invention, there is provided a piezoelectric device for generating an acoustic signal, including an expansion mechanism for expanding a displacement of mechanical vibration, a vibration subunit, a vibration subunit, a case for storing the vibration unit, and a coil placed in the case. The expansion mechanism includes an elastic member that is an elastic rectangular plate, a vibration output member that is a rectangular plate being more rigid than the elastic member, and a base member that is an elastic rectangular plate being more massive than the vibration output member and more rigid than the elastic member, and having one end portion facing the vibration output member being connected with one end of the vibration output member by the elastic member. The vibration subunit includes a piezoelectric element interposed between the base member and the vibration output member in a position between a center and one side end of the vibration output member connected to the base member, a positioning plate for positioning between a center and the one side end of the vibration output member connected to the base member, a base weight fixed to the base member and having a female thread in at least one surface, a first male thread for applying a pressure to the piezoelectric element by being fit to a female thread of the base member and fastened, a second male thread for fixing the base member and the base weight, and a female thread disposed in a position of the base member where the piezoelectric element is placed and allowing the second male thread to fit in. The vibration unit includes a pair of supporting members for supporting the vibration subunit in contact with both longitudinal side surfaces of the vibration output member and the base member, and a pad having a sheet-like shape substantially similar to the vibration output member and placed on an upper surface of the vibration output member through a sealing member.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

An acoustic vibration generating element according to an embodiment of the present invention is applicable to an acoustic vibration generating element or a loudspeaker that is used in a cell phone, a portable terminal and so on, a headphone that functions as acoustic equipment, acoustic equipment that uses bone conduction, and so on.

An exemplary embodiment of the present invention is described hereinafter in detail with reference to the drawings.

Figure 1A:
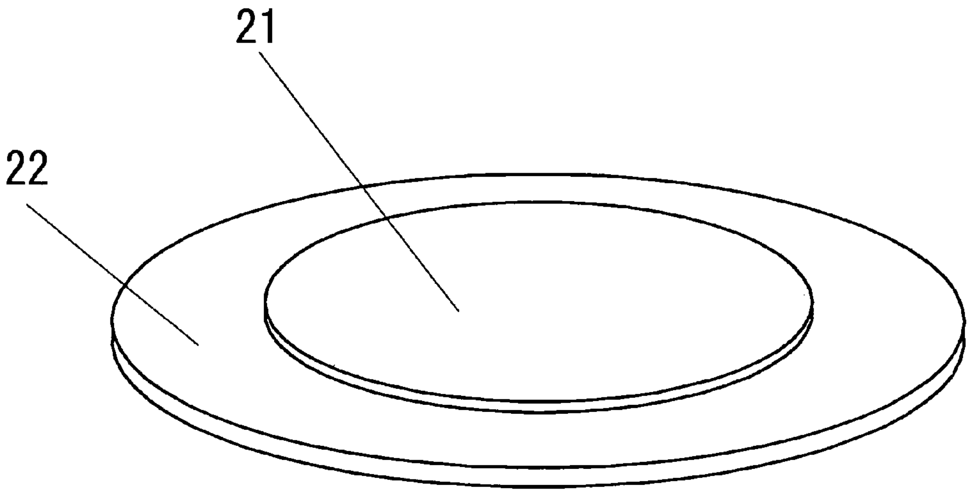
FIG. 1A is a perspective view showing a piezoelectric unimorph element.
Figure 1B:
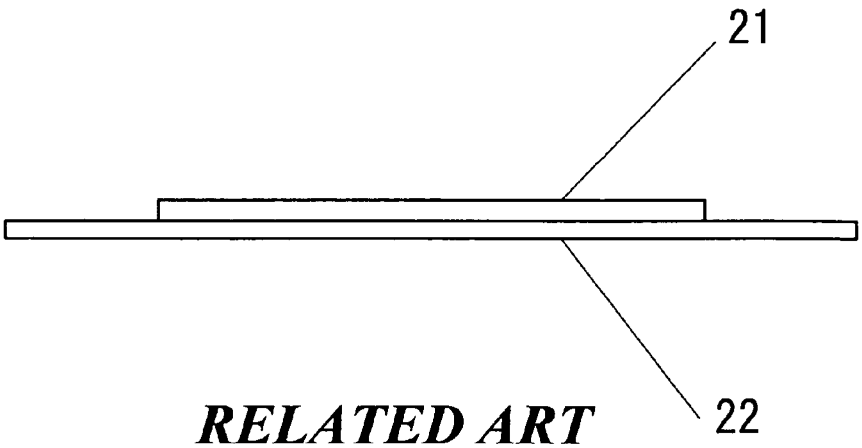
RELATED ART Fig. 1B
FIG. 1B is a side view showing a piezoelectric unimorph element.
Figure 2A:
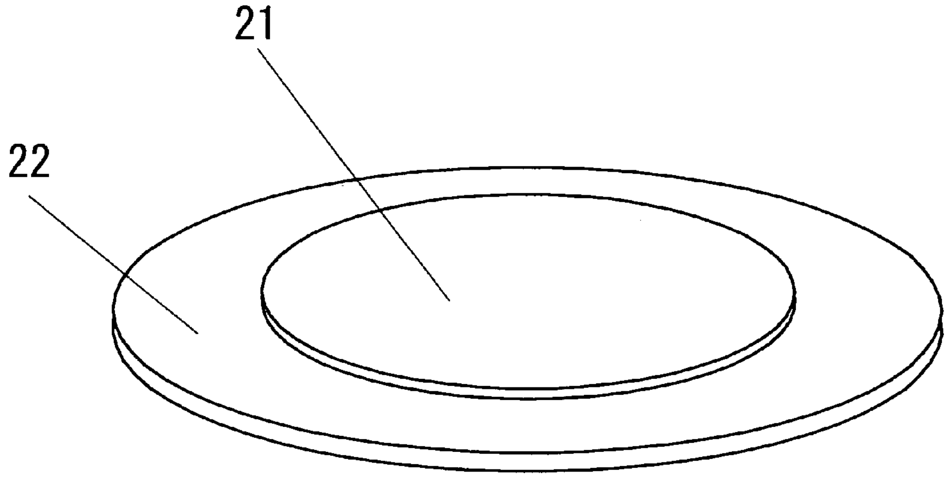
FIG. 2A is a perspective view showing a piezoelectric bimorph element.
Figure 2B:
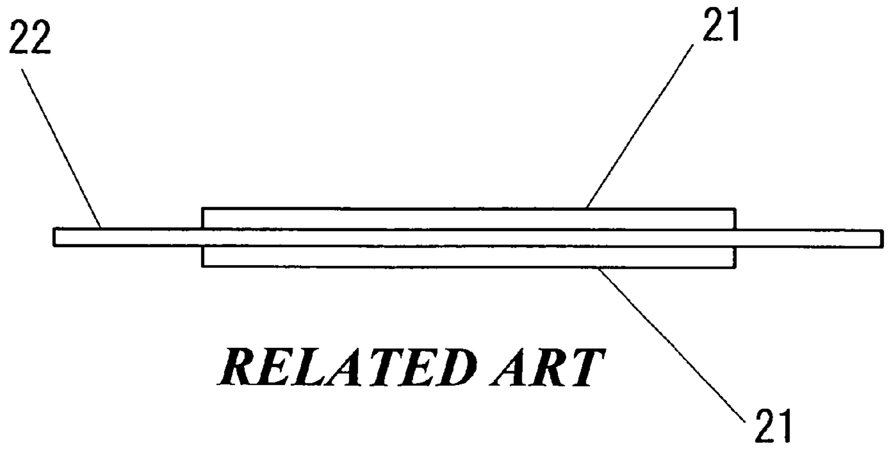
RELATED ART Fig. 2B
FIG. 2B is a side view showing a piezoelectric bimorph element.
Figure 3:
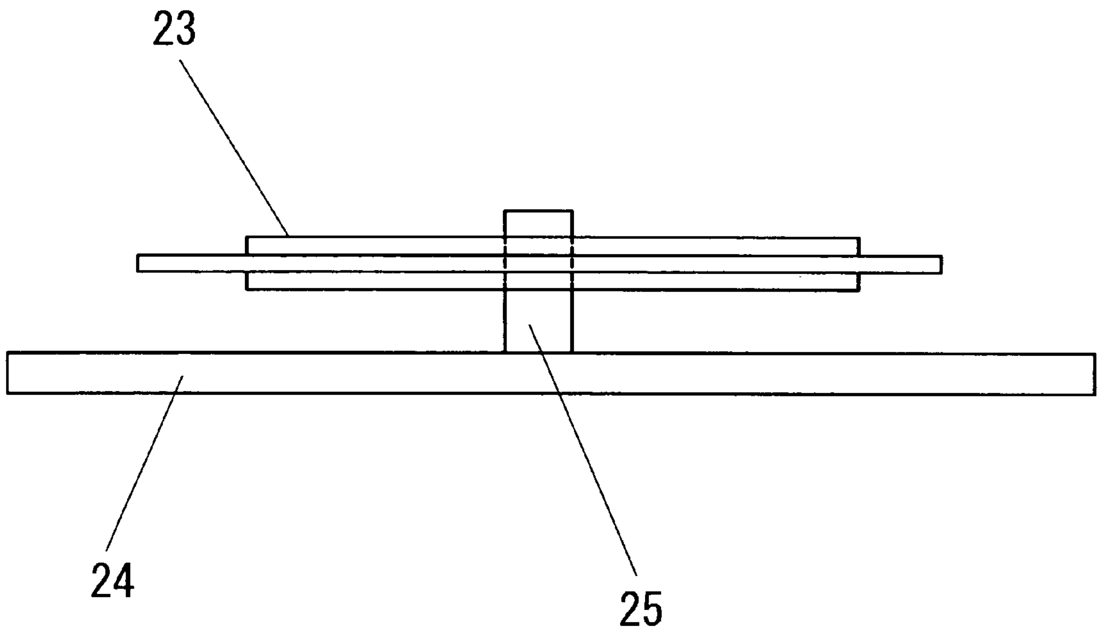
FIG. 3 is a side view showing a piezoelectric device for generating an acoustic signal according to a related art.
Figure 4:
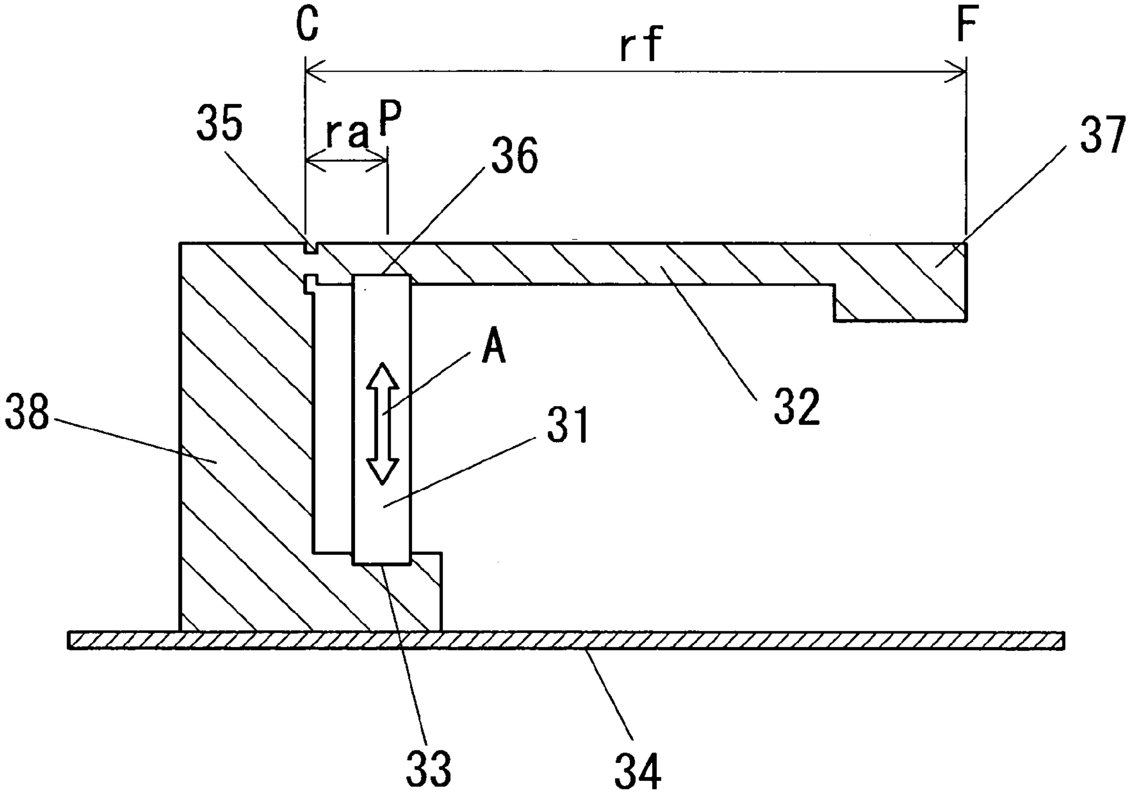
FIG. 4 is a pattern diagram showing a basic structure of a piezoelectric device for generating an acoustic signal according to an embodiment of the invention.

FIG. 4 is a pattern diagram showing a basic structure of a piezoelectric device for generating an acoustic signal according to an embodiment of the invention. The piezoelectric device for generating an acoustic signal includes a laminated piezoelectric actuator 31 that is a piezoelectric element, an expansion mechanism 32, and an acoustic vibration portion 37. The laminated piezoelectric actuator 31 may be a column with one end fixed to a fixation portion 33 that is formed in the expansion mechanism 32 and the other end fixed to a point of action 36 that is also in the expansion mechanism 32. The expansion mechanism 32 has a hinge 35 having a notch, and the acoustic vibration portion 37 that is a thickened part on an extension of the expansion mechanism 32 through the hinge 35 and the point of action 36. The fixation portion 33 of the expansion mechanism 32 is joined with a vibration receiver 34. Electrical wire connections are not illustrated in FIG. 4.

When a voltage is applied to the laminated piezoelectric actuator 31, the displacement in proportion to the applied voltage occurs in the direction indicated by the arrow A in FIG. 4. Thus, upon input of an acoustic electrical signal to the laminated piezoelectric actuator 31, the acoustic vibration in accordance with the acoustic electrical signal occurs in the laminated piezoelectric actuator 31. The displacement of the acoustic vibration leads to displacement of the point of action 36. The hinge 35 serves as a fulcrum, and the displacement is expanded by the principle of leverage and causes vibration of the acoustic vibration portion 37. The displacement of the vibration of the acoustic vibration portion 37 has an amplitude that is expanded at an expansion rate which is determined by a ratio of a distance ra between the hinge 35 as a fulcrum and the point of action 36 (distance C-P) and a distance rf between the hinge 35 and the acoustic vibration portion 37 (distance C-F). The vibration of the acoustic vibration portion 37 is transferred to the vibration receiver 34 through the fixation portion 33 of the expansion mechanism 32 to thereby vibrate the vibration receiver 34. Alternatively, the amplitude of the vibration of the acoustic vibration portion 37 may be used by direct contact with the vibration receiver 34. In such a case, a mass of the fixation portion 33 may be sufficiently larger than a mass of the acoustic vibration portion 37 to suppress vibration in the fixation portion 33 so that the vibration is concentrated in the acoustic vibration portion 37 to produce a still larger amplitude.

In this structure, even if the displacement generated by the laminated piezoelectric actuator 31 is small, it is possible to obtain a large displacement by expanding the displacement, thus enabling side reduction of the laminated piezoelectric actuator 31 itself, which cannot be attained in a conventional piezoelectric device for generating an acoustic signal using a piezoelectric unimorph element or a piezoelectric bimorph element. Further, the device of this embodiment may use a columnar, strong laminated piezoelectric actuator without using a piezoelectric ceramic plate of as thin as several tens to hundreds of μm as in the piezoelectric unimorph element or piezoelectric bimorph element, thus increasing the resistance to dropping impact. Furthermore, the fixation of the laminated piezoelectric actuator 31 to the expansion mechanism 32 applies a certain compressive stress to the laminated piezoelectric actuator 31 and also protects the laminated piezoelectric actuator 31 by an outer frame to increase a mechanical strength.

The laminated piezoelectric actuator 31 that is used in this embodiment generates the displacement in the longitudinal direction (the direction of the arrow A in FIG. 4) using piezoelectric longitudinal effect. The shape of the laminated piezoelectric actuator 31 is not particularly limited, and columnar shapes such as a rectangular column and a circular column are preferred for easier design. Further, the laminated piezoelectric actuator 31 can reduce a drive voltage to enable lower power consumption. If the laminated piezoelectric actuator 31 has a lamination structure in the thickness direction in which electrodes are divided into two groups per layer to allow polarization and voltage application to be performed per layer, it is possible to reduce a drive voltage significantly.

Though the expansion mechanism 32 has a cantilever structure in FIG. 4, it may have a bridge structure or a multistage structure with multiple hinges. Further, the disposition can be expanded in the same manner by forming an elastic support 38 and highly rigid acoustic vibration portion 37 and fixation portion 33 rather than forming the hinge. The expansion mechanism 32 may be formed of a metal such as stainless steel and brass or a rigid plastic. Particularly, the stainless steel is a suitable material for forming an acoustic vibration system because of its moderate elasticity and specific gravity. It is preferred to form the hinge, the acoustic vibration portion, and the fixation portion of the laminated piezoelectric actuator in an integral form for reduction of the number of parts to enhance miniaturization.

The inertial force due to the acoustic vibration of the acoustic vibration portion 37 that is expanded by the expansion mechanism 32 is transferred through the support 38 to the vibration receiver 34 that is fixed at the bottom of the support 38. The vibration receiver 34 is thereby vibrated to function as a loudspeaker. As described earlier, it is possible to contact the acoustic vibration portion 37 with the vibration receiver 34 to directly use the amplitude of the vibration of the acoustic vibration portion 37 itself. Particularly, in the application which requires an amplitude such as a bone conduction speaker, it is preferred to use the amplitude of the acoustic vibration portion 37.

Figure 5:
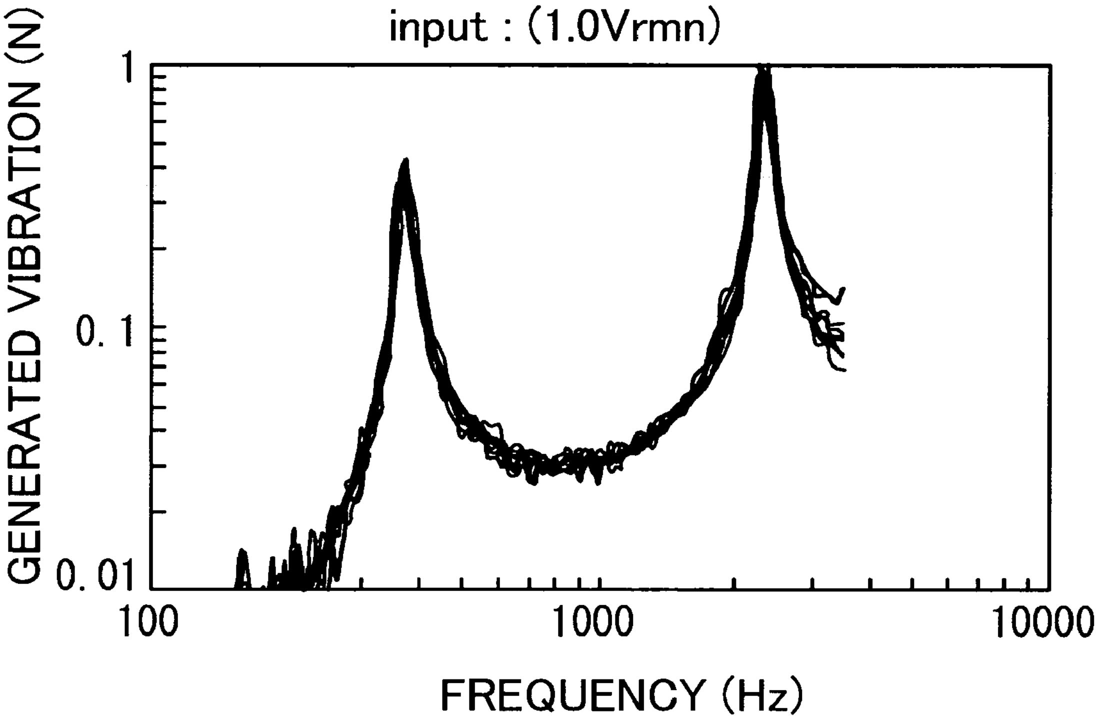
FIG. 5 is a graph showing acoustic characteristics of a piezoelectric device for generating an acoustic signal according to a related art.

FIG. 5 is a graph showing acoustic characteristics of a piezoelectric device for generating an acoustic signal according to a related art. It shows the result of measurement by a vibration sensor on the inertial force that is generated in a support 38 due to vibration of a cantilever composed of a piezoelectric bimorph element. If a primary resonant frequency is set to 300 Hz, a peak is at the primary and high order resonance. The resonance contributes to increasing the amplitude of vibration and it may be effectively used for the formation of frequency characteristics. On the other hand, the amplitude of vibration that outstands at a specific frequency is not suitable as a loudspeaker in terms of acoustic characteristics. It is thus preferred to appropriately suppress the vibration in the vicinity of the resonant frequency.

An exemplary embodiment of the present invention is described hereinafter with reference to the drawings. The embodiment described below is described by way of illustration, and the present invention is not limited thereto but may be altered in various ways.

Figure 6:
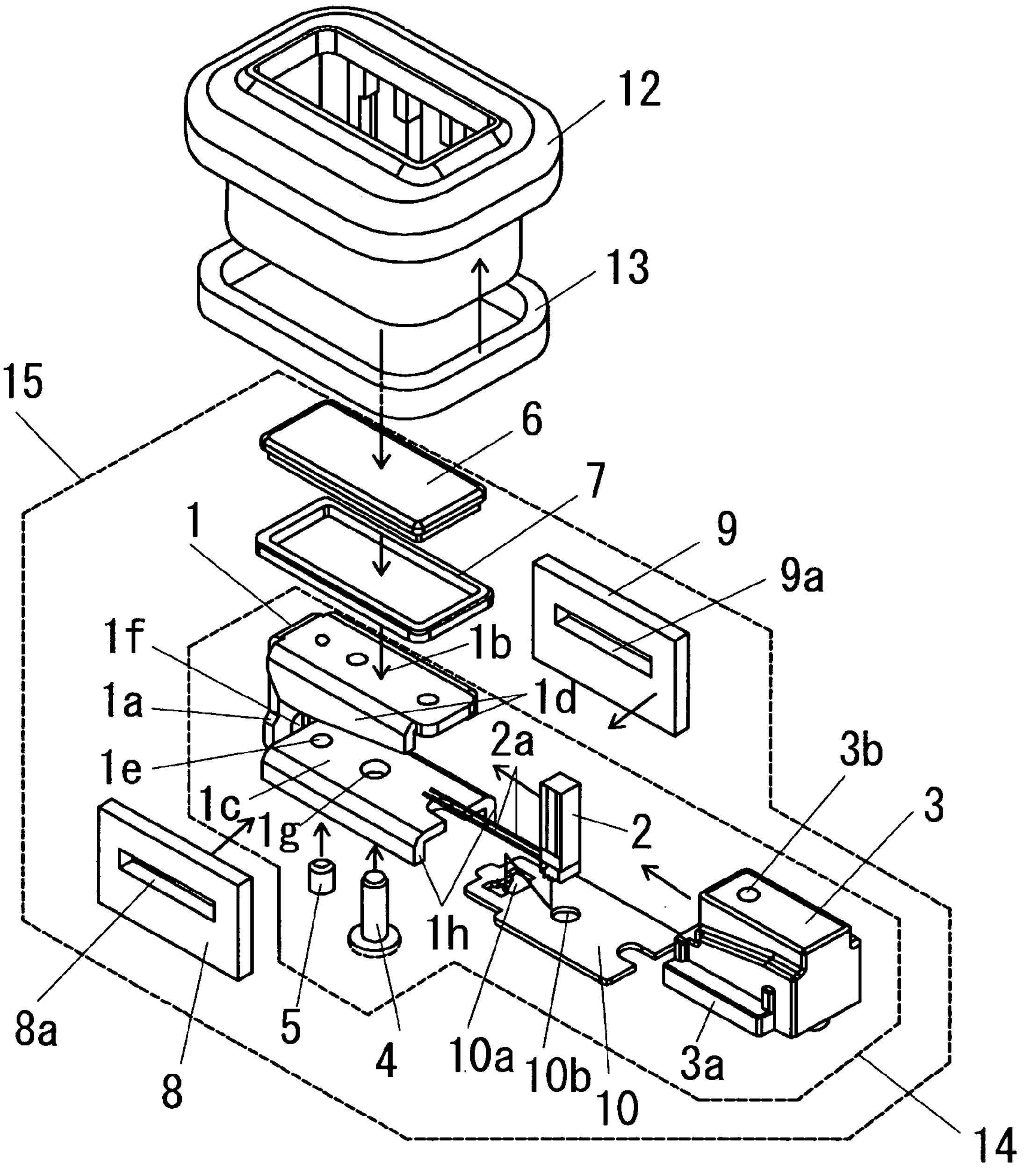
FIG. 6 is an exploded diagram showing an exemplary embodiment of the invention.

FIG. 6 is an exploded diagram showing an exemplary embodiment of the present invention. In outline, a piezoelectric device for generating an acoustic signal of this embodiment includes a vibration unit 15, a case 12, and a T coil 13. The vibration unit 15 includes a vibration subunit 14, a pair of supporting members 8 and 9, a sealing member 7, and a pad 6. The vibration subunit 14 includes an expansion mechanism 1, a piezoelectric element 2, a positioning plate 10, a base weight 3, a first male thread 5, and a second male thread 4. The expansion mechanism 1 includes an elastic member 1*a*, a vibration output member 1*b*, and a base member 1*c*.

The structure of the vibration subunit 14 is detailed with reference to FIG. 6. In the vibration subunit 14, the elastic member 1*a*, the vibration output member 1*b*, and the base member 1*c* that constitute the expansion mechanism 1 are integrally formed into a substantially horseshoe shape by pressing a stainless plate of about 1 mm in thickness. The vibration output member 1*b* and the base member 1*c* are opposed to each other with the elastic member 1*a* interposed therebetween. The vibration output member 1*b* is substantially rectangular, and ribs 1*d* that extend downward are formed on both longitudinal sides by the pressing. The base member 1*c* is also substantially rectangular, and ribs 1*h* that extend downward are formed on both longitudinal sides by the pressing. The ribs 1*d* and 1*h* are formed to increase the rigidity of the vibration output member 1*b* and the base member 1*c*. Because of the ribs 1*h*, the base member 1*c* is more rigid than the elastic member 1*a*. The base member 1*c* is more massive than the vibration output member 1*b*.

Figure 7:
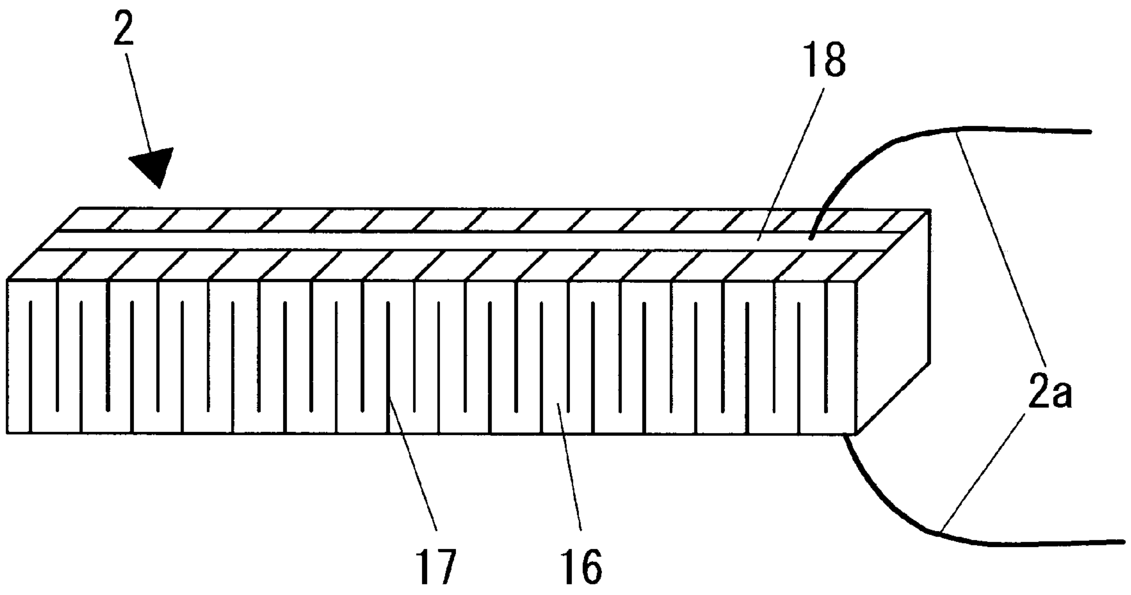
FIG. 7 is a perspective view showing a piezoelectric element according to an exemplary embodiment of the invention.

FIG. 7 is a perspective view showing a piezoelectric element according to this embodiment. The piezoelectric element 2 used in this embodiment is a laminated piezoelectric actuator that are composed of an internal electrode 17 and a piezoelectric ceramic 16 which are burned into an integral form. A pair of external electrodes 18 (the external electrode 18 at the bottom is not shown in FIG. 7) are electrically connected to the internal electrode 17, and input lines 2*a* are connected thereto. In this embodiment, a columnar laminated piezoelectric actuator having an outer shape of 2 mm×2 mm×9 mm available from NEC TOKIN Corporation is used as the piezoelectric element 2, for example. In the laminated piezoelectric actuator, the internal electrode 17 and the piezoelectric ceramic 16 are laminated on one another in the longitudinal direction and burned into an integral form so that there are 30 layers of the piezoelectric ceramics 16, each interposed between the internal electrodes 17. Upon input of an acoustic electrical signal through the input line 2*a*, the laminated piezoelectric actuator generates mechanical vibration in accordance with the voltage and frequency of the input signal in the longitudinal direction.

In FIG. 6, one end of the piezoelectric element 2 is inserted to an atypical opening 10*a* that is preformed in the positioning plate 10. The piezoelectric element 2 and the positioning plate 10 are inserted together to an opening of the expansion mechanism 1 from the side opposite from the elastic member 1*a* so that they are placed between the vibration output member 1*b* and the base member 1*c*. The piezoelectric element 2 is thereby placed in the position that is equidistant from the two longer sides of the vibration output member 1*b* and closer to the side (shorter side) of the elastic member 1*a* than to the opposite side. The other end of the piezoelectric element 2 contacts the vibration output member 1*b* and is fixed thereto by an epoxy bonding agent.

The end of the piezoelectric element 2 which is inserted to the atypical opening 10*a* of the positioning plate 10 is placed right above a female thread 1*e* formed in the base member 1*c*. At the same time, the first thread 5 is fit into the female thread 1*e* in the base member 1*c* and fastened to thereby pressurize the piezoelectric element 2.

In simple vibration operation, a compressive force and a tractive force of substantially the same level act alternatively in the longitudinal direction in the columnar piezoelectric element such as a laminated piezoelectric actuator. These forces are proportional to an inertial mass of the vibration portion and further proportional to the square of vibration frequency. If the vibration frequency becomes higher, the forces become larger significantly. On the other hand, because the columnar piezoelectric element such as a laminated piezoelectric actuator is resistant to the compressive force, but is not resistant to the tractive force in the longitudinal direction. Therefore, it is necessary to reduce the tractive force acting during operation in order for the efficient use of a small element. It is thus effective to apply a pressure to create a state as if a compressive force already acts during non-operation.

A method for pressurizing the piezoelectric actuator as the piezoelectric element 2 during assembly is detailed below. If the piezoelectric element 2 that is inserted between the vibration output member 1*b* and the base member 1*c* of the expansion mechanism 1 is placed so that an upper surface of the piezoelectric element 2 contacts the inner surface of the vibration output member 1*b*, a space is consequently created between its lower surface and the upper surface of the base member 1*c*. The first male thread 5 can fill the space to adjust it and further press up to apply a compressive force onto the piezoelectric element 2 by a reactive force mainly from a bending transformation of the elastic member 1*a* of the expansion mechanism 1. The compressive force increases in proportion to the screwing amount of the first male thread 5. Thus, while a change in the relative distance between the end portions of the vibration output member 1*b* and the base member 1*c* is measured, the first male thread 5 is screwed until reaching such a displacement under which a predetermined pressure that is determined by the measurement result is applied. After that, the lower end of the piezoelectric element 2 together with the first male thread 5, the base member 1*c*, and the atypical opening 10*a* of the positioning plate 10 are fixed by a bonding agent. The state where a compressive pressure is applied to the piezoelectric element 2 during non-operation is thereby realized.

When no pressure is applied, the tractive force of substantially the same level as the compressive force acts on the piezoelectric element 2. Due to the compressive force that is already applied during non-operation, the force that acts upon operation shifts to the compressive side, so that the compressive force increases while the tractive force decreases. Application of an appropriate pressure enables the working range of the compressive force and the tractive force acting during operation to fall at the center of the range of an allowable compressive force and the range of an allowable tractive force.

The upper surface of the piezoelectric element 2 is in contact with the inner surface of the vibration output member 1*b*. An epoxy bonding agent is injected through a small opening in the vibration output member 1*b* to fix the surfaces and the peripheral part. The bonding agent is preferably the one that is cured slowly after the application of a pressure or the one that is cured upon increase in temperature. Further, the atypical opening 10*a* of the positioning plate 10 regulates the positions of the four side surfaces of the piezoelectric element 2 to prevent the piezoelectric element 2 from being deviated from appropriate position and orientation by receiving a turning force of the first male thread 5 during the application of a pressure.

The base weight 3 is a rectangular solid that may be formed of a zinc die-cast material. The base weight 3 has protrusions 3*a* on both sides (one protrusion is not illustrated in FIG. 6) and a female thread 3*b* that penetrates to a bottom end. The second male thread 4 is fit into the female thread 3*b* through a through-hole 1*g* of the base member 1*c*, thereby fixing the base weight 3 to the base member 1*c*. The mass of the base weight 3 is set so that the total mass of the base weight 3, the positioning plate 10, and the base member 1*c* is about five times the total mass of the vibration output member 1*b* and a pad 6 described later. Because the weight of the unit of the base member 1*c* is set greater than the weight of the unit of the vibration output member 1*b*, when the displacement of the vibration of the piezoelectric element 2 is expanded, the vibration is not transferred to the base member 1*c* but concentrated on the vibration output member 1*b*. Consequently, sound leakage that is caused by the vibration of the base member 1*c* is significantly reduced. This effect can be obtained if the mass of the unit of the base member 1*c* is at least twice the mass of the unit of the vibration output member 1*b*. The base weight 3 and the positioning plate 10 maybe combined into an integral form. Though a zinc die-cast material is used for the base weight 3 in this embodiment, other metal may be used as long as the above mass is obtained.

A space between the upper surface of the base weight 3 and the lower surface of the vibration output member 1*b* is as small as about 0.3 mm. This is for obtaining the mass of the base weight 3 in a small space and for increasing an opening space between the end portions of the base member 1*c* and the vibration output member 1*b* for easier measurement when applying a pressure. An opening space between the edge of the base weight 3 that is integral with the base member 1*c* and the end of the vibration output member 1*b* is measured, and a measurement distance is set to 1 mm or below, thereby increasing a changing ratio of the opening space.

Figure 8A:
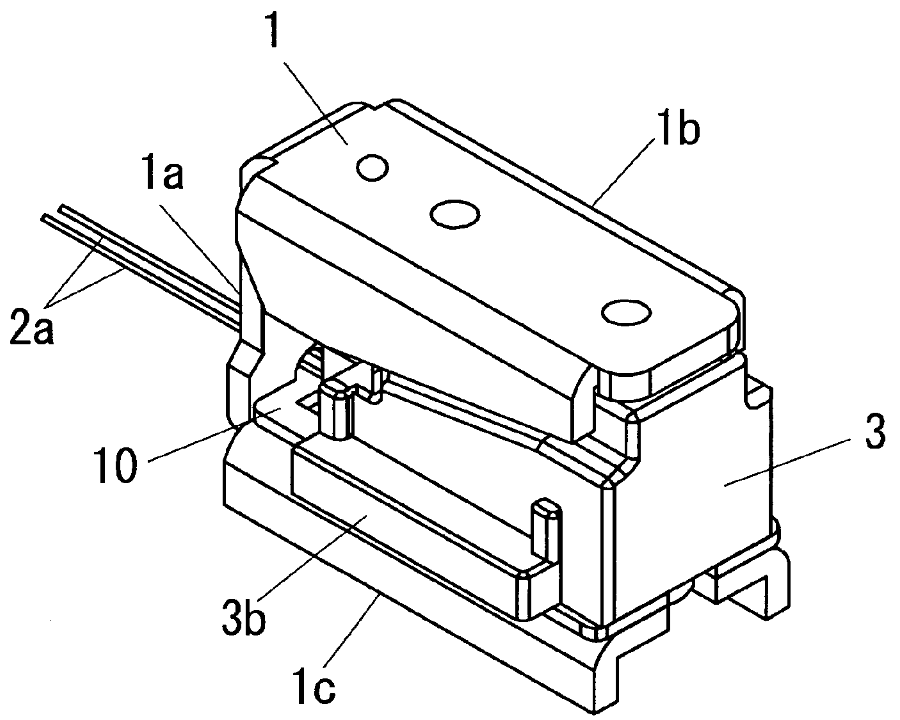
FIG. 8A is a perspective view showing a vibration subunit according to an exemplary embodiment of the invention.
Figure 8B:
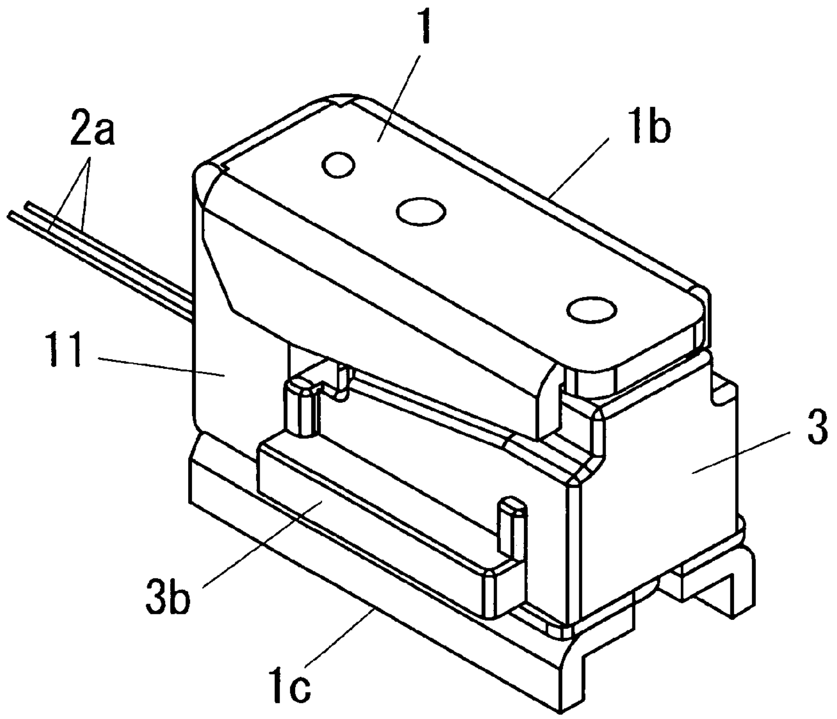
FIG. 8B is a perspective view showing a vibration subunit according to an exemplary embodiment of the invention after a rubbery member is cast.

FIGS. 8A and 8B are perspective views showing the vibration subunit 14 according to this embodiment. FIG. 8A illustrates the vibration subunit 14 which has the structure described above. This embodiment further casts a rubbery member 11 in the vicinity of the piezoelectric element 2 (not shown) that is surrounded by the elastic member 1*a*, the vibration output member 1*b* and the base member 1*c*. FIG. 8B is a perspective view showing the vibration subunit 14 after the rubbery member 11 is cast. The outer shape of the vibration subunit 14 is as small as about 18 mm in length, 8 mm in width, and 13 mm in height.

The structure of this embodiment has a resonance point that is likely to appear in an acoustic frequency range. The presence of the resonance point increases the vibration output in the vicinity but at the same time causes unwanted sound leakage. An appropriate attenuation adjustment element is therefore needed. The rubbery member 11 serves as an attenuation element. Appropriate adjustment of the attenuation performance of the rubbery member 11 produces suitable vibration characteristics and suppresses unwanted sound leakage. The rubbery member 11 also has the function of water and moisture proof sealing for protecting the piezoelectric element 2 that is vulnerable to moisture.

The vibration subunit 14 applies an alternating voltage to the piezoelectric element 2 to cause a displacement of expansion and contraction vibration in the longitudinal direction. As a result of the displacement, the vibration output member 1*b* and the base member 1*c* are reciprocally pressed and displaced while vibrating with the elastic member 1*a* being bend and transformed. Because the vibration subunit 14 has a leverage structure, even if the amount of expansion and contraction of the piezoelectric element 2 is about 2 to 3 μm, for example, the displacement at the center of the vibration output member 1*b* is expanded about 3 to 5 times, thus generating the vibration that has an enough amplitude to produce a sufficient sound volume.

The structure of the vibration unit 15 is described in detail with reference to FIG. 6. The vibration unit 15 has a pair of supporting members 8 and 9 that may be formed of a silicon rubber sheet on both surfaces of the vibration subunit 14. The vibration unit 15 also has the pad 6 that may be formed of a resin which is placed on the upper surface of the vibration output member 1*b* of the vibration subunit 14 with the sealing member 7 that may be formed of a rounded rectangular sponge interposed therebetween. The supporting members 8 and 9 have rectangular holes 8*a* and 9*a*, respectively, into which the protrusions 3*a* on both sides of the base weight 3 of the vibration subunit 14 are fit for fixation.

The supporting members 8 and 9 absorb vibration that is different from the vibration generated by the vibration output member 1*b* of the vibration subunit 14 to prevent the vibration from being transferred to other parts, thereby suppressing vibration that causes sound leakage. Though the supporting members 8 and 9 are formed of a silicon rubber sheet in this embodiment, it may be other viscous and elastic member such as a rubber vibration isolator or a gel material with a base of silicone having a hardness of 5 degrees or less.

The pad 6 has a plate shape that is similar to the shape of the upper surface of the vibration output member 1*b*. The pad 6 is preferably formed of a material with low thermal conductivity in order to avoid uncomfortable feeling upon direct contact of a skin with a cold metal part of the vibration output member 1*b* during winter season, for example. It is also preferred to use a material with low specific gravity and high rigidity in order to suppress an increase in the mass of the vibration portion and maintain high rigidity to thereby prevent generation of secondary vibration inside the vibration output member 1*b*.

Figure 9:
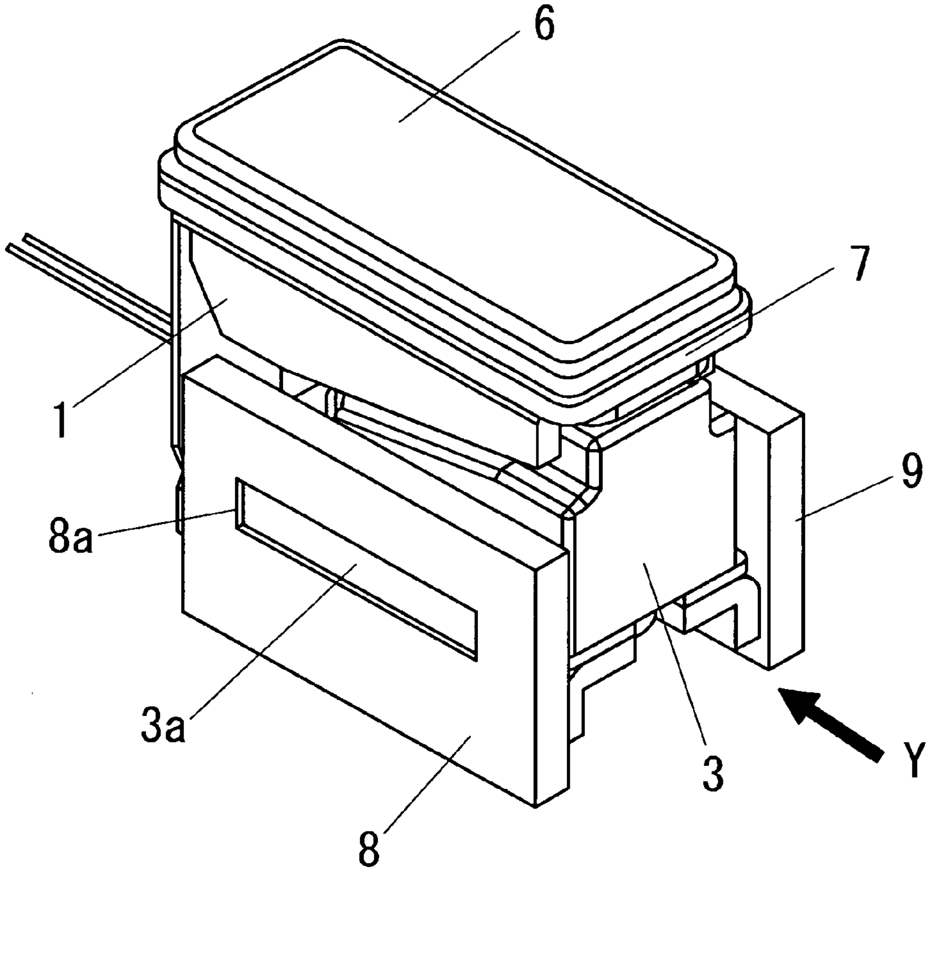
FIG. 9 is a perspective view showing a vibration unit according to an exemplary embodiment of the invention.
Figure 10:
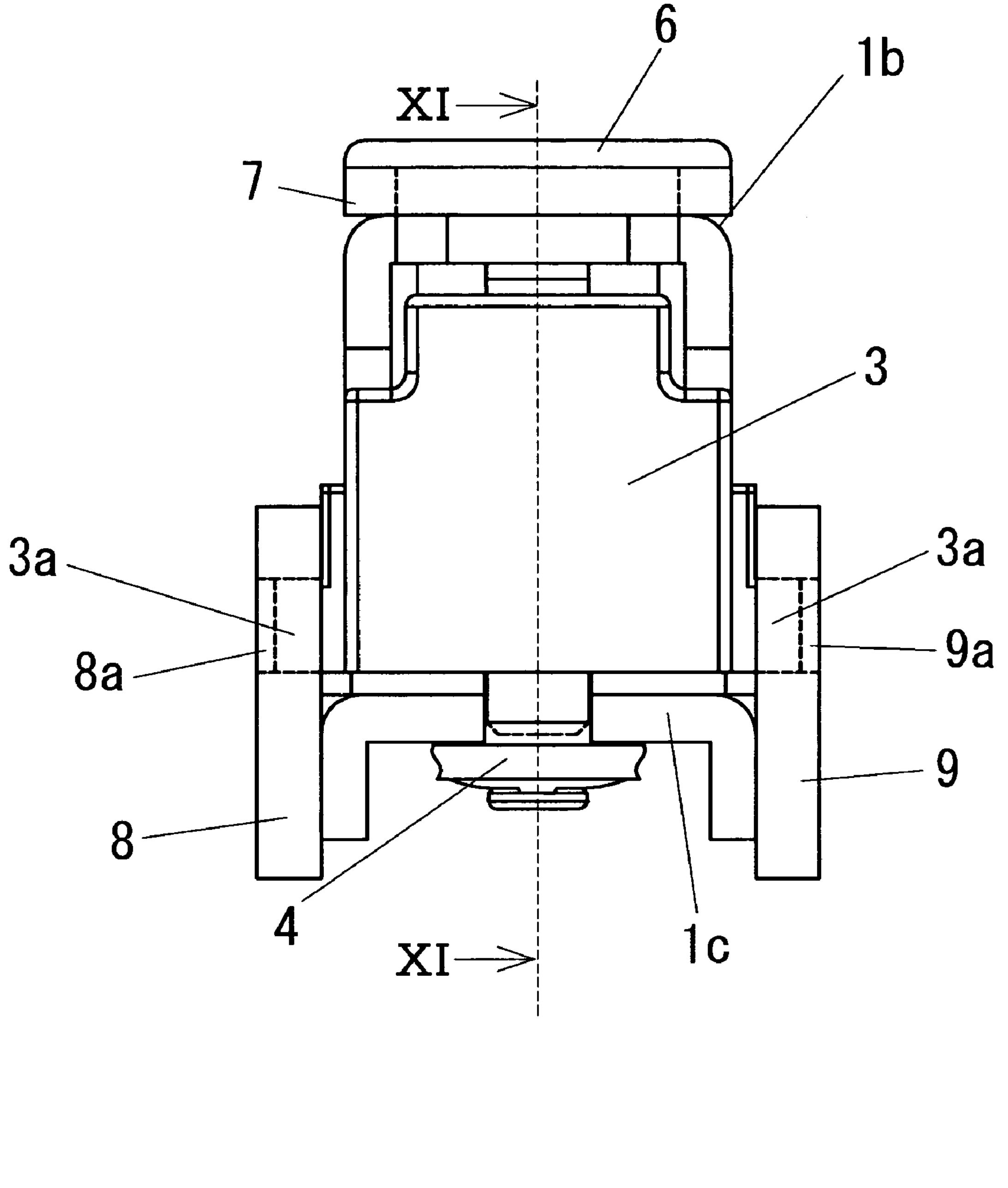
FIG. 10 is a front view showing a vibration unit according to an exemplary embodiment of the invention viewed in the direction of an arrow Y in FIG. 9.
Figure 11:
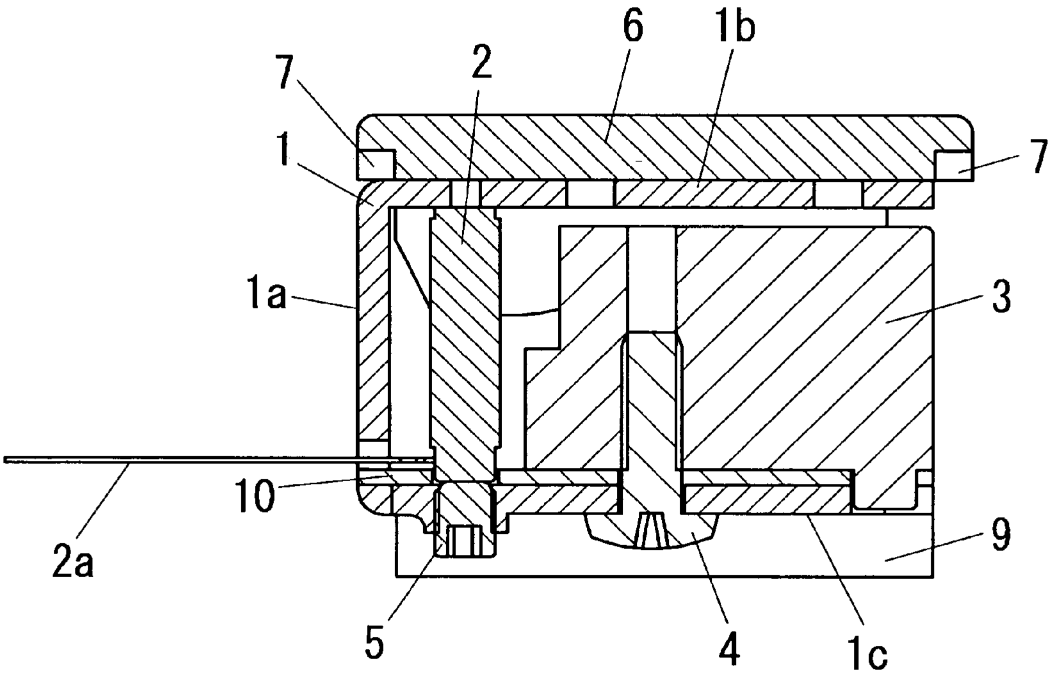
FIG. 11 is a sectional view along line XI-XI in FIG. 10.

The structure of the vibration unit 15 is as described above. FIG. 9 is a perspective view showing the vibration unit 15 according to this embodiment. FIG. 10 is a front view of the vibration unit 15 of this embodiment viewed in the direction of the arrow Y in FIG. 9. FIG. 11 is a sectional view along line XI-XI of FIG. 10.

A piezoelectric device for generating an acoustic signal according to this embodiment is described hereinafter in detail with reference to FIG. 6. The piezoelectric device for generating an acoustic signal of this embodiment inserts the vibration unit 15 into a tubular case 12 formed of a polycarbonate resin. The case 12 holds and restricts the positions of the supporting members 8 and 9 by a rib or the like. The opening at the bottom of the case 12 is closed by another case member (not shown), and, by holding the edges of the supporting members 8 and 9, the piezoelectric device for generating an acoustic signal is elastically supported by the case 12.

In the case 12, a rectangular ring T coil 13 is placed to surround a bone conduction speaker unit. The T coil 13 serves as an oscillator that outputs an acoustic signal as an electromagnetic wave to other acoustic equipment, hearing aid and so on that are used together. The coil 13 is thus used in combination with acoustic equipment, hearing aid and so on that capture an electromagnetic wave emitted from the T coil 13 and convert it back to an acoustic signal without using the piezoelectric device for generating an acoustic signal.

A space between the case 12 and the vibration output member 1*b* or the pad 6 is filled by the sealing member 7 for controlling dust and preventing transfer of vibration to the case 12. Though the sealing material 7 may be a super soft material, it is preferred to use a material such as a sponge that is soft and transmits air easily in order to avoid the sealing material 7 from generating sound by receiving vibration.

The vibration output member 1*b* and the base member 1*c* move with each other by vibration displacement so that the end portions open and shut during operation. However, because the mass of the unit of the base member 1*c* including the base member 1*c* integrally fixed to the positioning plate 10 and the base weight 3 is sufficiently larger than the mass of the vibration output member 1*b*, it is the vibration output member 1*b* that mainly moves. The base member 1*c* unit that is supported receives less vibration, and the vibration that is transferred to the supporting portion is small. Thus, together with vibration blocking function by the characteristics of the supporting members 8 and 9, the amount of vibration transferred to the case, which is a main cause for sound leakage, is significantly reduced. The effect is greater as the mass of the base member 1*c* unit is larger. An appropriate configuration may be determined in view of weight and size as a component.

Figure 12:
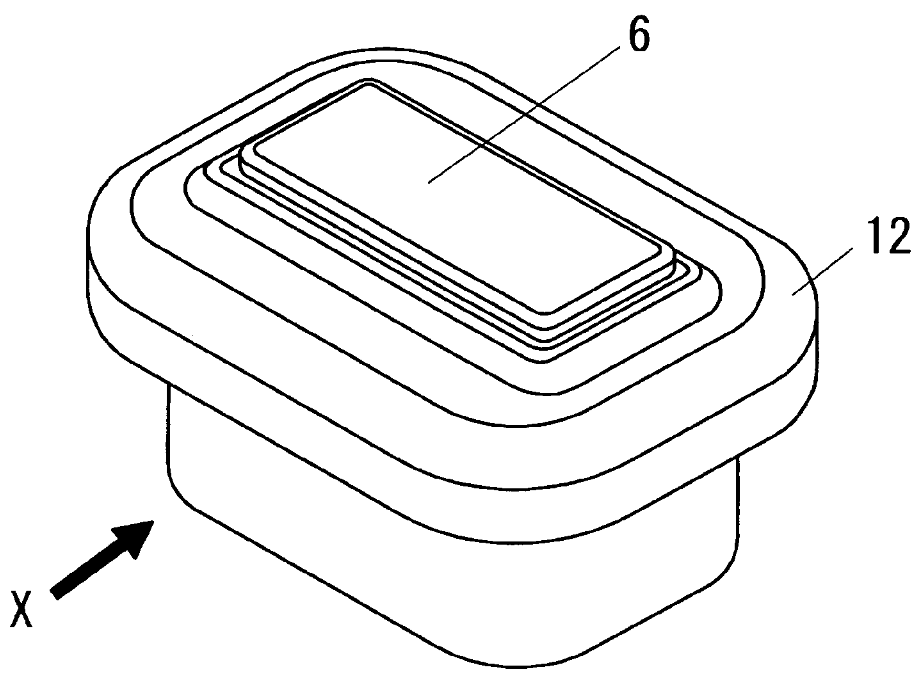
FIG. 12 is a perspective view showing an exemplary embodiment of the invention
Figure 13:
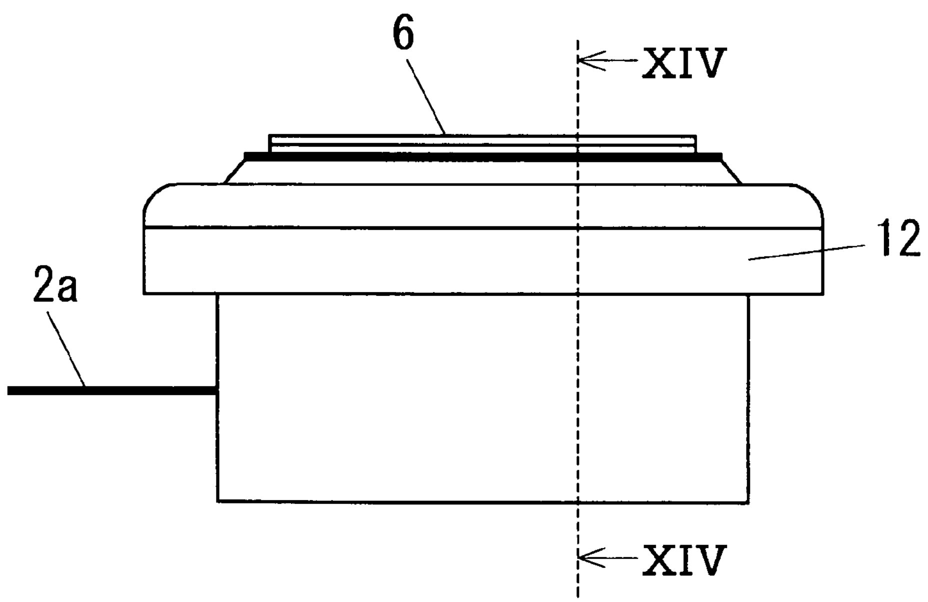
FIG. 13 is a side view showing an exemplary embodiment of the invention
Figure 14:
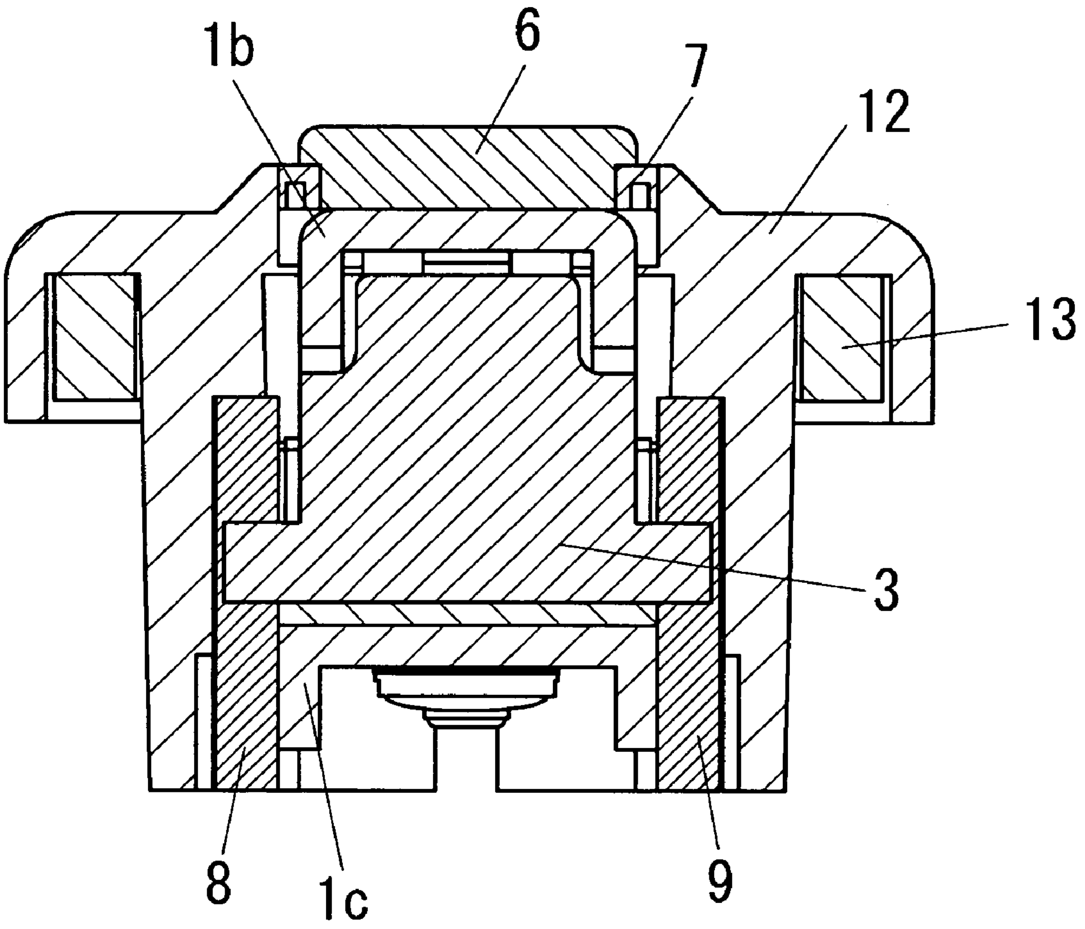
FIG. 14 is a sectional view along line XIV-XIV in FIG. 13.

FIG. 12 is a perspective view showing this embodiment. FIG. 13 is a side view also showing this embodiment. FIG. 14 is a sectional view along line XIV-XIV in FIG. 13.

Figure 15:
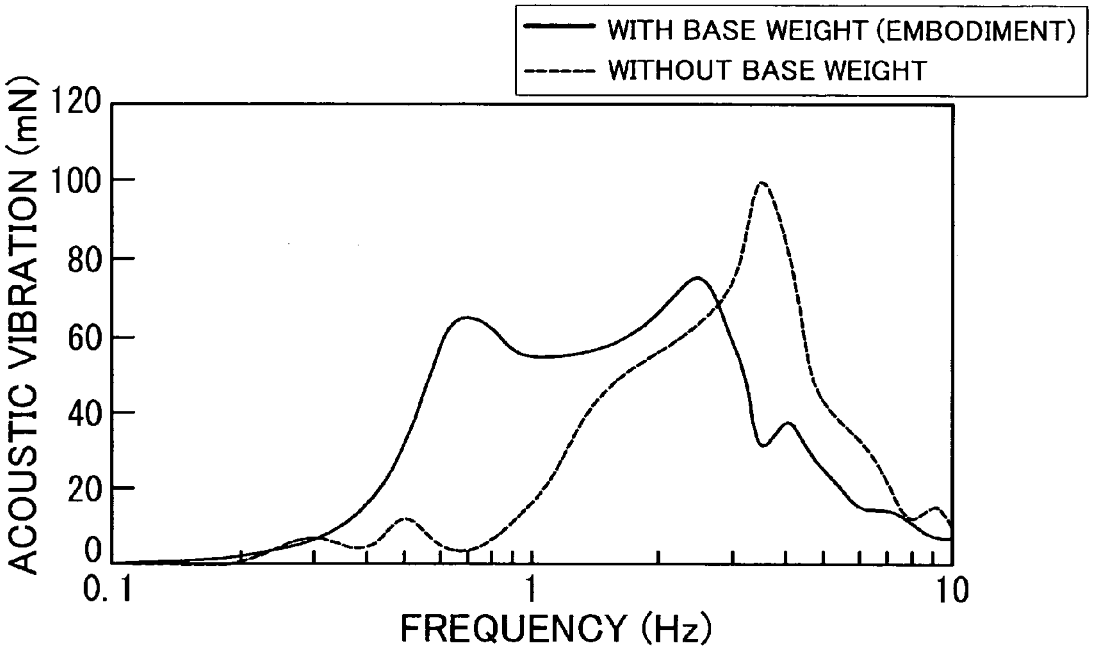
FIG. 15 is a graph showing acoustic output characteristics according to an exemplary embodiment of the invention.

FIG. 15 is a graph showing acoustic output characteristics of this embodiment. The horizontal axis of the graph indicates frequency and the vertical axis indicates acoustic output. The graph of FIG. 15 shows the characteristics when the base weight 3 is used and when not used. As shown in FIG. 15, the acoustic output when the base weight 3 is used is large over a wider frequency range than when the base weight 3 is not used. This results from that base weight 3 is fixed to the base member 1*c* so that the mass of the base member 1*c* unit is larger than the mass of the vibration output member 1*b* unit, and thereby the acoustic vibration is concentrated on the side of the vibration output member 1*b* in the piezoelectric device for generating an acoustic signal of this exemplary embodiment.

Figure 16:
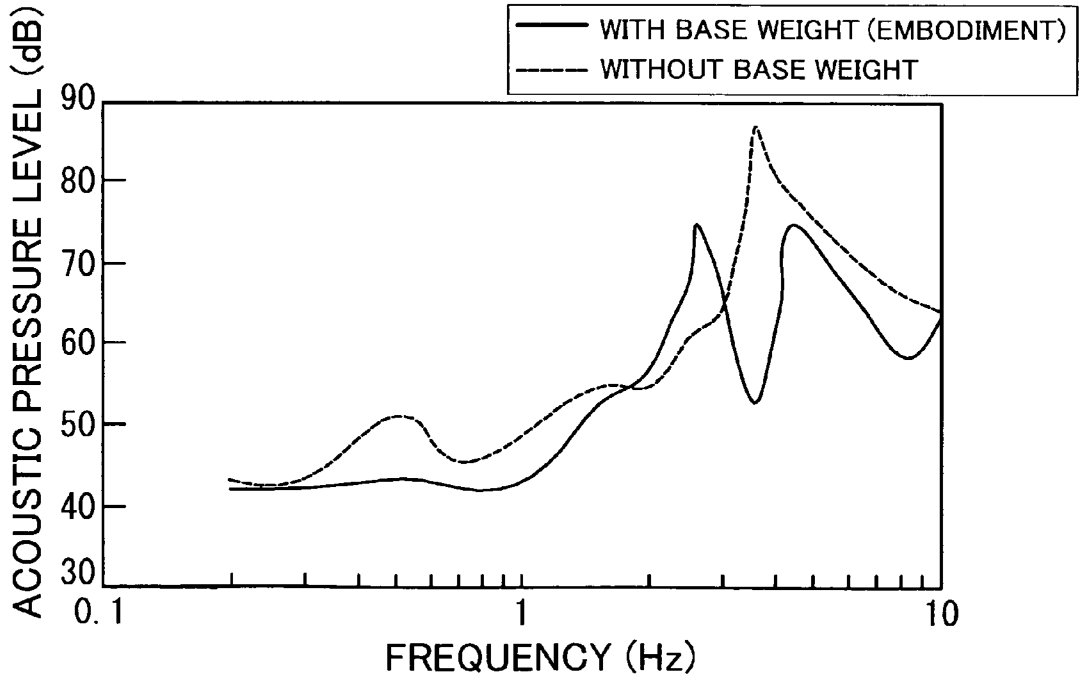
FIG. 16 is a graph showing an acoustic pressure level of sound leakage according to an exemplary embodiment of the invention.

FIG. 16 is a graph showing an acoustic pressure level of sound leakage in this embodiment. The horizontal axis of the graph indicates frequency and the vertical axis indicates an acoustic pressure level of sound leakage. The graph of FIG. 16 shows the characteristics when the base weight 3 is used and when not used. As shown in FIG. 16, an acoustic pressure level of sound leakage when the base weight 3 is used is overall lower than when the base weight 3 is not used. This results from that base weight 3 is fixed to the base member 1*c* so that the mass of the base member 1*c* unit is larger than the mass of the vibration output member 1*b* unit, and thereby the vibration in the base member 1*c* that is fixed to the case 12 is suppressed, and the supporting members 8 and 9, the sealing member 7 and the rubbery member 11 greatly contribute to absorption and suppression of vibration.

As described in the foregoing, the embodiment of the invention enables provision of a piezoelectric device for generating an acoustic signal that is a small size, highly resistant to dropping impact, and has good acoustic performance with less sound leakage.

It is apparent that the present invention is not limited to the above embodiment that may be modified and changed without departing from the scope and spirit of the invention.

What is claimed is:

1. A piezoelectric device for generating an acoustic signal, comprising:

- a piezoelectric element for converting an electrical signal into mechanical vibration;
- an expansion mechanism for expanding a displacement of the mechanical vibration generated by the piezoelectric element; and
- an acoustic vibration portion for transferring the displacement of the mechanical vibration expanded by the expansion mechanism as acoustic vibration, wherein
- the expansion mechanism comprises an elastic member, a vibration output member having a plate shape being more rigid than the elastic member, and a base member having a plate shape being more rigid than the elastic member and more massive than the vibration output member, the base member and the vibration output member face each other with the piezoelectric element interposed therebetween, one end portions of the base member and the vibration output member facing each other are connected by the elastic member, and the piezoelectric element is placed between one end of the vibration output member connected to the base member by the elastic member and a center of the vibration output member.

2. The piezoelectric device for generating an acoustic signal according to claim 1, wherein the expansion mechanism has a beam structure.

3. The piezoelectric device for generating an acoustic signal according to claim 1, wherein at least a part of the expansion mechanism is formed by pressing a metal plate.

4. The piezoelectric device for generating an acoustic signal according to claim 1, wherein the piezoelectric element is a columnar, and the expansion mechanism includes a pressurization portion for applying a compressive force to the piezoelectric element in a longitudinal direction.

5. The piezoelectric device for generating an acoustic signal according to claim 1, wherein the piezoelectric element is a columnar, and the expansion mechanism includes a thread for applying a compressive force that is adjustable by a fastening force of the thread to the piezoelectric element in a longitudinal direction.

6. The piezoelectric device for generating an acoustic signal according to claim 1, wherein the piezoelectric element is surrounded by a viscous member or an elastic member in all directions different from a direction of an end of the piezoelectric element.

7. A piezoelectric device for generating an acoustic signal, comprising:

an expansion mechanism for expanding a displacement of mechanical vibration, the expansion mechanism comprising:

an elastic member that is an elastic rectangular plate, a vibration output member that is a rectangular plate being more rigid than the elastic member, and a base member that is an elastic rectangular plate being more massive than the vibration output member and more rigid than the elastic member, and having one end portion facing the vibration output member being connected with one end of the vibration output member by the elastic member, and;

a vibration subunit including the expansion mechanism, the vibration subunit comprising:

a piezoelectric element interposed between the base member and the vibration output member in a position between a center and one side end of the vibration output member connected to the base member, a positioning plate for positioning between a center and the one side end of the vibration output member connected to the base member, a base weight fixed to the base member and having a female thread in at least one surface, a first male thread for applying a pressure to the piezoelectric element by being fit to a female thread of the base member and fastened, a second male thread for fixing the base member and the base weight, and a female thread disposed in a position of the base member where the piezoelectric element is placed and allowing the second male thread to fit in;

a vibration unit including the vibration subunit, the vibration unit comprising:

a pair of supporting members for supporting the vibration subunit in contact with both longitudinal side surfaces of the vibration output member and the base member, and a pad having a sheet-like shape substantially similar to the vibration output member and placed on an upper surface of the vibration output member through a sealing member;

a case for storing the vibration unit; and a coil placed in the case.

* * * * *